United States Patent
Akiyama et al.

(10) Patent No.: US 8,129,775 B2
(45) Date of Patent: Mar. 6, 2012

(54) SEMICONDUCTOR DEVICE AND METHOD OF MANUFACTURING THE SAME

(75) Inventors: Koji Akiyama, Nirasaki (JP); Hirokazu Higashijima, Nirasaki (JP); Tetsushi Ozaki, Nirasaki (JP); Tetsuya Shibata, Nirasaki (JP)

(73) Assignee: Tokyo Electron Limited (JP)

( * ) Notice: Subject to any disclaimer, the term of this patent is extended or adjusted under 35 U.S.C. 154(b) by 236 days.

(21) Appl. No.: 12/630,296

(22) Filed: Dec. 3, 2009

(65) Prior Publication Data

US 2010/0148241 A1    Jun. 17, 2010

(30) Foreign Application Priority Data

Dec. 15, 2008   (JP) .................. 2008-318606

(51) Int. Cl.
*H01L 29/792* (2006.01)

(52) U.S. Cl. ............ 257/324; 257/326; 257/E21.423; 257/E29.309; 438/591

(58) Field of Classification Search .......... 257/324, 257/E21.423, E29.309, 326; 438/591
See application file for complete search history.

(56) References Cited

U.S. PATENT DOCUMENTS

| | | |
|---|---|---|
| 2008/0087944 A1 | 4/2008 | Shin et al. |
| 2008/0116507 A1 | 5/2008 | Ino et al. |
| 2008/0233762 A1 | 9/2008 | Hong |
| 2008/0315288 A1 | 12/2008 | Kikuchi et al. |
| 2009/0124070 A1* | 5/2009 | Yoo et al. ............. 438/591 |

FOREIGN PATENT DOCUMENTS

| | | |
|---|---|---|
| CN | 101330108 | 12/2008 |
| JP | 2006-203200 | 8/2006 |
| JP | 2008-016814 | 1/2008 |
| JP | 2008-034814 | 2/2008 |
| KR | 10-2007-0114519 | 12/2007 |
| KR | 10-0805018 | 2/2008 |
| KR | 10-2008-0031594 | 4/2008 |
| KR | 10-2008-0045646 | 5/2008 |

OTHER PUBLICATIONS

Korean Office Action-Korean Application No. 10-2009-0094569 issued on May 23, 2011, citing CN 101330108, KR 10-2008-0045646, KR 10-2007-0114519, KR 10-2008-0031594, and KR 10-0805018.

* cited by examiner

*Primary Examiner* — Roy Potter

(74) *Attorney, Agent, or Firm* — Cantor Colburn LLP

(57) ABSTRACT

The semiconductor device has a stacked structure in which a tunnel oxide layer, a charge trapping layer, a blocking oxide layer, and a gate electrode are sequentially formed on a silicon substrate, wherein the blocking oxide layer includes a crystalline layer disposed adjacent to the charge trapping layer and an amorphous layer disposed adjacent to the gate electrode.

11 Claims, 8 Drawing Sheets

SEMICONDUCTOR DEVICE AND METHOD OF MANUFACTURING THE SAME

CROSS-REFERENCE TO RELATED PATENT APPLICATIONS

This application claims the benefit of Japanese Patent Application No. 2008-318606, filed on Dec. 15, 2008, in the Japan Patent Office, the disclosure of which is incorporated herein in its entirety by reference.

BACKGROUND OF THE INVENTION

1. Field of the Invention

The present invention relates to a semiconductor device and a method of manufacturing the same.

2. Description of the Related Art

Conventionally, in the technical field of semiconductor device, so-called charge trapping type non-volatile memory devices (flash memory) are known, The semiconductor devices includes a tunnel oxide layer, a charge trapping layer, a blocking oxide layer, and a gate electrode, which are sequentially formed on a silicon substrate.

Known examples of structures of such charge trapping type non-volatile memory devices include a SONOS structure (a stacked structure of a polysilicon layer, a $SiO_2$ (amorphous) layer, a SiN layer, a $SiO_2$ layer, and a silicon substrate), a SANOS structure (a stacked structure of a polysilicon layer, an $Al_2O_3$ (crystalline) layer, a SiN layer, a $SiO_2$ layer, and a silicon substrate), a TANOS structure (a stacked structure of a TaN layer, an $Al_2O_3$ (crystalline) layer, a TaN layer, a $SiO_2$ layer, and a silicon substrate), and a MANOS structure (a stacked structure of a metal layer, a $Al_2O_3$ (crystalline) layer, a TaN layer, a $SiO_2$ layer, and a silicon substrate).

As stated above, a conventional charge trapping type non-volatile memory device employs a $SiO_2$ (amorphous) layer, an $Al_2O_3$ (crystalline), or a high-k layer ($HfO_2$ (crystalline) layer) as a blocking oxide layer (Refer to Patent Reference 1, Patent Reference 2, and Patent Reference 3).

[Patent Reference 1] Japanese Patent Laid-Open Publication No. 2006-203200

[Patent Reference 2] Japanese Patent Laid-Open Publication No. 2008-16814

[Patent Reference 3] Japanese Patent Laid-Open Publication No. 2008-34814

SUMMARY OF THE INVENTION

If a $SiO_2$ (amorphous) layer is used as a blocking oxide layer as described above, when data is erased by injecting holes into a charge trapping layer from a silicon substrate, writing due to electrons from a gate electrode occurs, and thus the window characteristic of an erasing portion deteriorates.

Meanwhile, if an $Al_2O_3$ (crystalline) layer or a high-k layer ($HfO_2$ (crystalline) layer) is used as a blocking oxide layer, the blocking oxide layer is crystallized, and thus a hole trap is formed in the blocking oxide layer. As a result, the window characteristic of an erasing portion is improved. However, since a leak path is formed in the blocking oxide layer due to the crystallization, charges are leaked from the charge trapping layer, and thus the retention characteristic of a non-volatile memory device including the blocking oxide layer deteriorates.

To solve the above and/or other problems, the present invention provides a semiconductor device having excellent window characteristics and retention characteristics and a method of manufacturing the semiconductor device.

According to an aspect of the present invention, there is provided a semiconductor device having a stacked structure in which a tunnel oxide layer, a charge trapping layer, a blocking oxide layer, and a gate electrode are sequentially formed on a silicon substrate, wherein the blocking oxide layer includes a crystalline layer disposed adjacent to the charge trapping layer and an amorphous layer disposed adjacent to the gate electrode.

The charge trapping layer includes SiN.

The crystalline layer includes any one of $Al_2O_3$, $HfO_2$, $ZrO_2$, $Ta_2O_5$, $Y_2O_3$, or a lanthanoid oxide.

The amorphous layer includes any one of a $SiO_2$ layer, an aluminum silicate layer, an $Al_2O_3$ layer, or an $Al_2O_3$—$SiO_2$ laminated layer.

According to another aspect of the present invention, there is provided a semiconductor device having a stacked structure in which a tunnel oxide layer, a charge trapping layer, a blocking oxide layer, and a gate electrode are sequentially formed on a silicon substrate, wherein the charge trapping layer includes a crystalline layer, and the blocking oxide layer includes an amorphous layer.

The crystalline layer includes any one of $Al_2O_3$, $HfO_2$, $ZrO_2$, $Ta_2O_5$, $Y_2O_3$, or a lanthanoid oxide.

The amorphous layer comprises any one of $SiO_2$ layer, aluminum silicate layer, $Al_2O_3$ layer, $Al_2O_3$—$SiO_2$ laminate layer.

According to another aspect of the present invention, there is provided a method of manufacturing a semiconductor device, in which a tunnel oxide layer, a charge trapping layer, a blocking oxide layer, and a gate electrode are sequentially formed on a silicon substrate, wherein the blocking oxide layer is formed using a method including forming a crystalline layer on the charge trapping layer; and forming an amorphous layer over the crystalline layer.

The formation of the crystalline layer includes forming an amorphous layer on the charge trapping layer; and heating the amorphous layer, so that the amorphous layer is crystallized to serve as the crystalline layer.

The forming of the crystalline layer and the forming of the amorphous layer is consecutively performed by a batch processing apparatus within a same cylindrical processing container, wherein the batch processing apparatus, vertically stacks a plurality of the silicon substrates to be apart from each other within the processing container and processes the silicon substrates, and comprises a mechanism for supplying processing gas into the processing container, a mechanism for plasmarizing the processing gas, a mechanism for heating the silicon substrates, and a mechanism for vacuum-exhausting the internal atmosphere of the processing container.

According to another aspect of the present invention, there is provided a method of manufacturing a semiconductor device, in which a tunnel oxide layer, a charge trapping layer, a blocking oxide layer, and a gate electrode are sequentially formed on a silicon substrate, wherein the blocking oxide layer is formed using a method including forming a first amorphous layer on the charge trapping layer; forming a second amorphous layer, which is not easily crystallized by the first amorphous layer, on the first amorphous layer; and crystallizing the first amorphous layer by heating at a temperature at which the first amorphous layer is to be crystallized and the second amorphous layer is not to be crystallized.

The forming of the first amorphous layer and the forming of the second amorphous layer is consecutively performed by a batch processing apparatus within a same cylindrical processing container, wherein the batch processing apparatus vertically stacks a plurality of the silicon substrates to be apart from each other within the processing container and processes the silicon substrates, and comprises a mechanism for supplying processing gas into the processing container, a mechanism for plasmarizing the processing gas, a mechanism for heating the silicon substrates, and a mechanism for vacuum-exhausting the internal atmosphere of the processing container.

According to another aspect of the present invention, there is provided a method of manufacturing a semiconductor device, in which a tunnel oxide layer, a charge trapping layer, a blocking oxide layer, and a gate electrode are sequentially formed on a silicon substrate, wherein the forming of the charge trapping layer includes forming a crystalline layer, and forming of the blocking oxide layer includes forming an amorphous layer.

The forming of the charge trapping layer and the forming of the blocking oxide layer is consecutively performed by a batch processing apparatus within a same cylindrical processing container, wherein the batch processing apparatus vertically stacks a plurality of the silicon substrates to be apart from each other within the processing container and processes the silicon substrates, and comprises a mechanism for supplying processing gas into the processing container, a mechanism for plasmarizing the processing gas, a mechanism for heating the silicon substrates, and a mechanism for vacuum-exhausting the internal atmosphere of the processing container.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
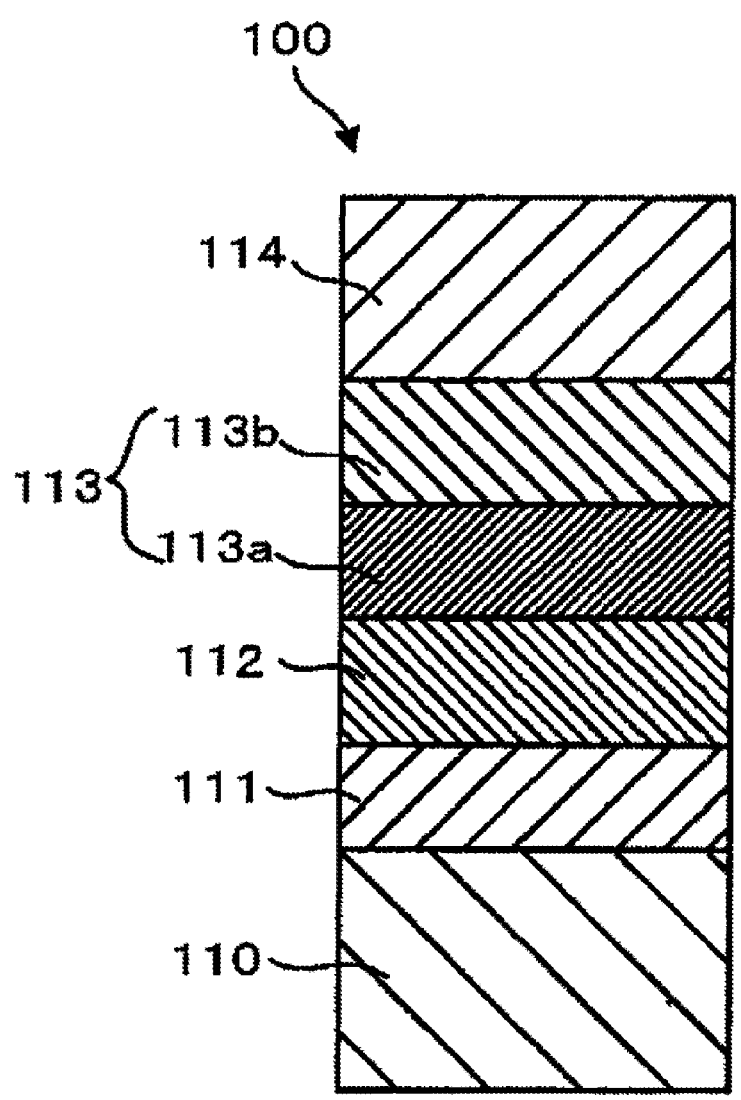
FIG. 1 is a diagram schematically showing the sectional view of the configuration of the major portion of a semiconductor device according to an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

FIG. 1 is a magnified diagram schematically showing the sectional view of the configuration of the major portion of a semiconductor device 100 (a charge trapping type non-volatile memory device (flash memory)) according to an embodiment of the present invention. Referring to FIG. 1, the semiconductor device 100 according to the present embodiment has a stacked structure in which a tunnel oxide layer 111, a charge trapping layer 112, a blocking oxide layer 113, and a gate electrode 114 are sequentially stacked on a silicon substrate 110.

The tunnel oxide layer 111 is formed of a silicon oxide ($SiO_2$) layer, whereas the charge trapping layer 112 is formed of a silicon nitride (SiN) layer.

The blocking oxide layer 113 has a double-layer structure consisting of a crystalline layer 113a disposed adjacent to the charge trapping layer 112 and an amorphous layer 113b disposed adjacent to the gate electrode 114. The crystalline layer 113a may be formed of, for example, a crystalline alumina ($Al_2O_3$) layer or a crystallized high-k layer, such as $HfO_2$, $ZrO_2$, $Ta_2O_5$, $Y_2O_3$, and a lanthanoid oxide. The amorphous layer 113b may be, for example, a high temperature oxide (HTO) layer ($SiO_2$ layer), an aluminum silicate layer, an amorphous-$Al_2O_3$ layer, or an $Al_2O_3$—$SiO_2$ laminated layer.

The gate electrode 114 may be formed of a polysilicon layer, a TaN layer, a metal layer, or the like.

Figure 2:
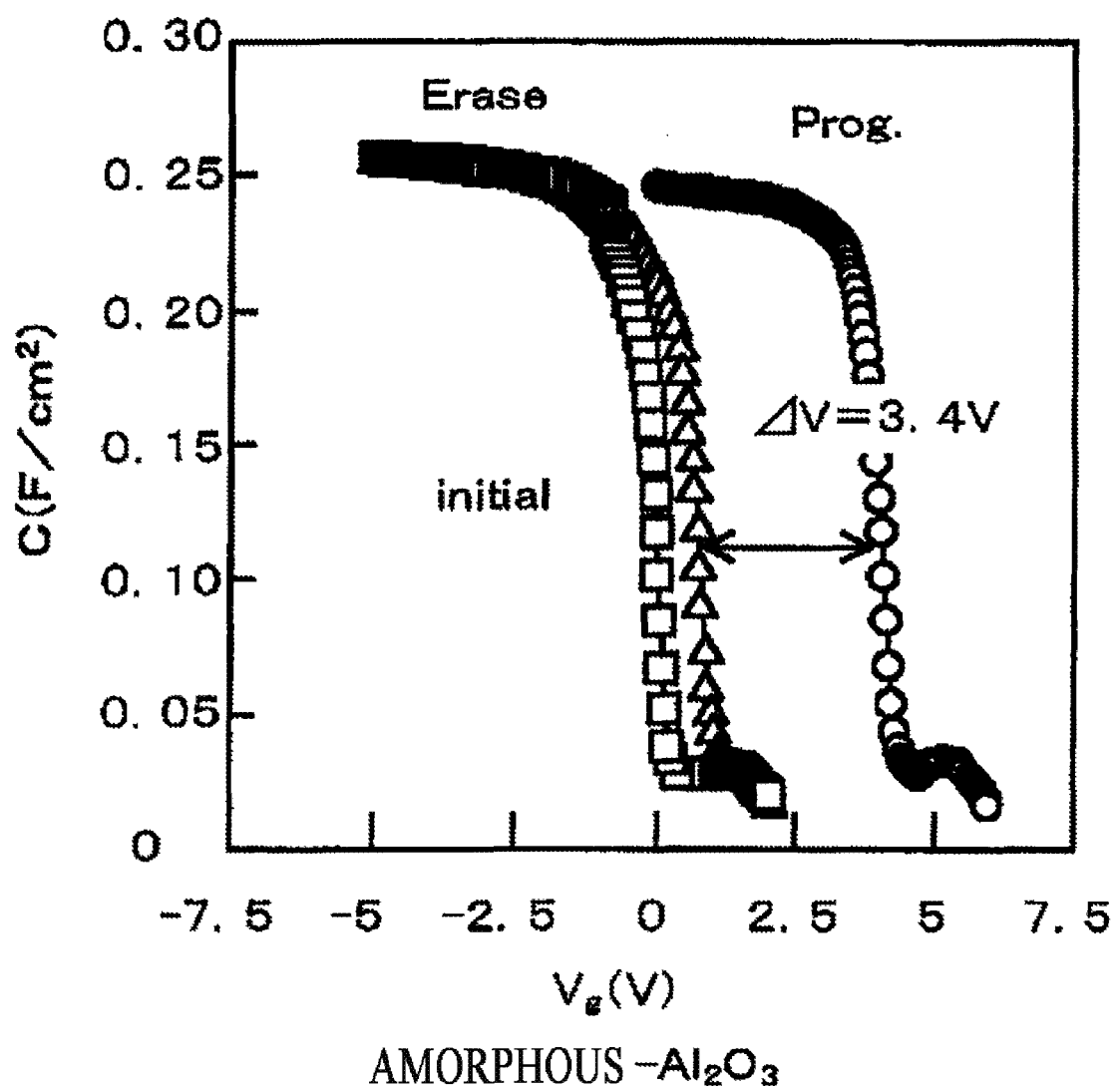
FIG. 2 is a diagram showing window characteristics of an amorphous layer.
Figure 3:
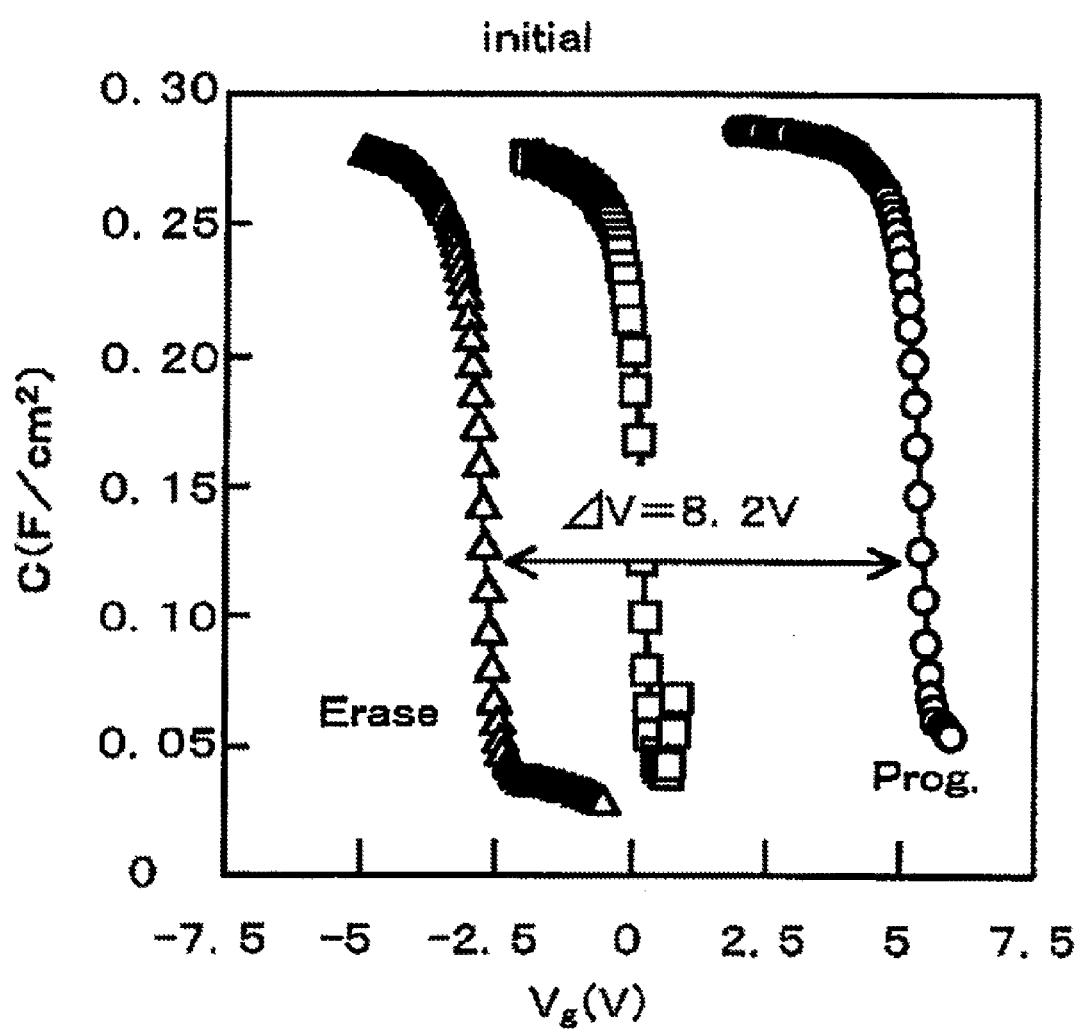
FIG. 3 is a diagram showing window characteristics of a crystalline layer.

FIGS. 2 and 3 are graphs respectively showing results of inspecting window characteristics of an amorphous layer (amorphous $Al_2O_3$ layer) and a crystalline layer (crystalline $Al_2O_3$ layer), wherein the vertical axis indicates the capacity ($C(F/cm^2)$) and the horizontal axis indicates the gate voltage ($Vg(V)$). Furthermore, in FIGS. 2 and 3, square plots indicate the initial state, the circle plots indicate programming (writing), and triangle plots indicate erasing (deleting). Referring to FIG. 3, if a crystalline layer is used as the blocking oxide layer 113, the window characteristic of an erasing portion is better than that of the amorphous layer shown in FIG. 2 ($\Delta V=3.4V$), and the crystalline layer exhibits an excellent window characteristic $\Delta V=8.2V$. The reason is that a hole trap is formed in the crystalline layer due to crystallization.

Figure 4:
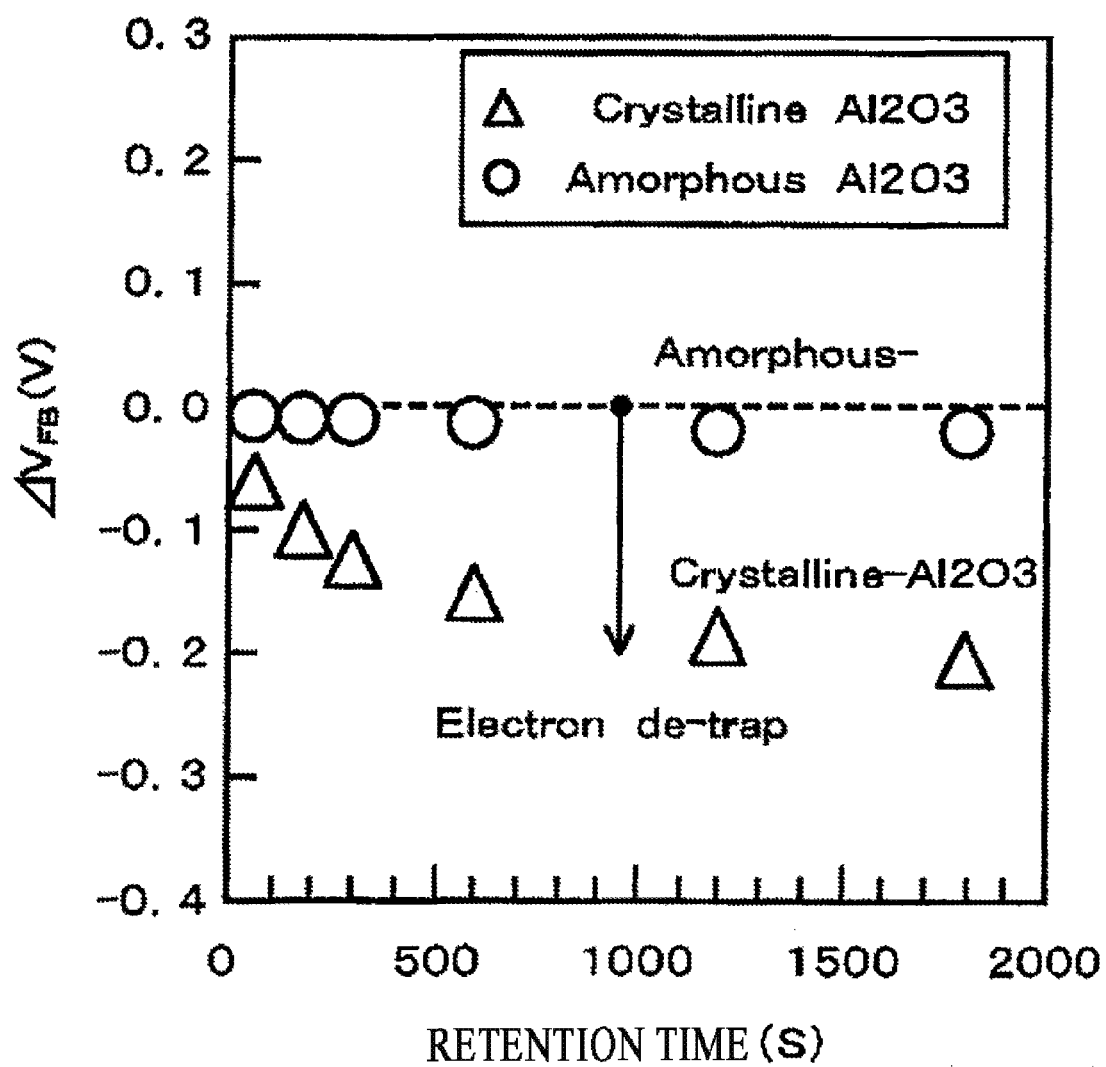
FIG. 4 is a diagram showing retention characteristics of an amorphous layer and a crystalline layer.

Meanwhile, FIG. 4 is a graph showing a result of inspecting retention characteristics of an amorphous layer (amorphous $Al_2O_3$ layer; indicated by a circle plot in FIG. 4) and a crystalline layer (crystalline $Al_2O_3$ layer; indicated by a triangle plot in FIG. 4), wherein the vertical axis indicates $\Delta VFB(V)$ and the horizontal axis indicates retention time (s). Referring to FIG. 4, the amorphous layer exhibits an excellent retention characteristic, whereas retention characteristic of the crystalline layer deteriorates due to electron leakage from the charge trapping layer 112.

As described above, when an amorphous layer is used as the blocking oxide layer 113, the retention characteristic is improved, but the window characteristic deteriorates. Meanwhile, when a crystalline layer is used as the blocking oxide layer 113, the window characteristic is improved, but the retention characteristic deteriorates. Therefore, the present embodiment provides a semiconductor device, which simultaneously exhibits an excellent window characteristic and an excellent retention characteristic, by employing a double-layer structure blocking oxide layer 113, in which the crystalline layer 113a, which improves window characteristics, faces the charge trapping layer 112 and the amorphous layer 113b, which improves retention characteristics, faces the gate electrode 114.

Furthermore, although the blocking oxide layer 113 has a double-layer structure, in which the crystalline layer 113a and the amorphous layer 113b are stacked, the blocking oxide layer 113 may also have a structure that the blocking oxide layer 113 is crystalline near the charge trapping layer 112 and gradually becomes amorphous toward the gate electrode 114.

Figure 5:
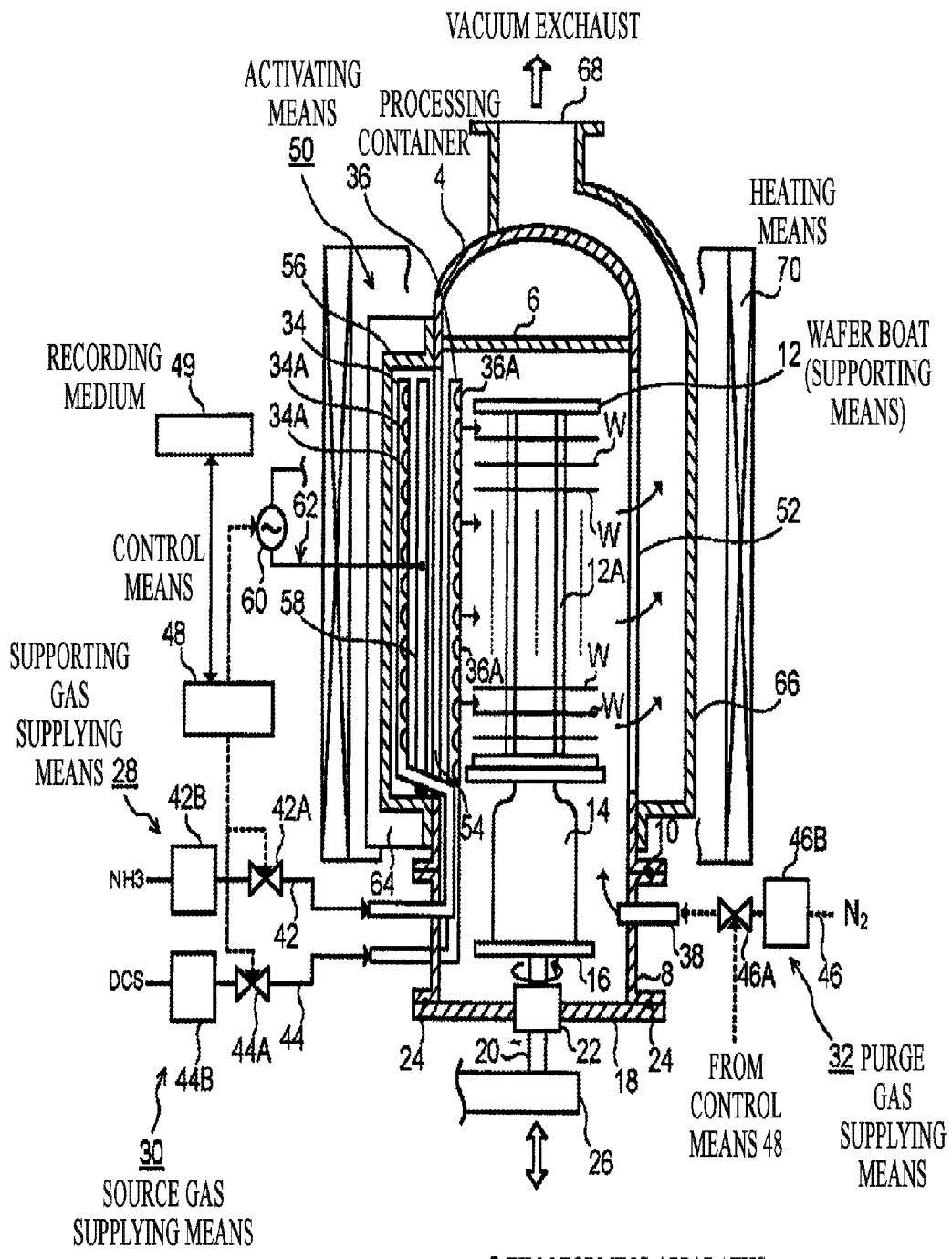
FIG. 5 is a sectional view of a semiconductor device manufacturing apparatus used in a method of manufacturing a semiconductor device according to an embodiment of the present invention.
Figure 6:
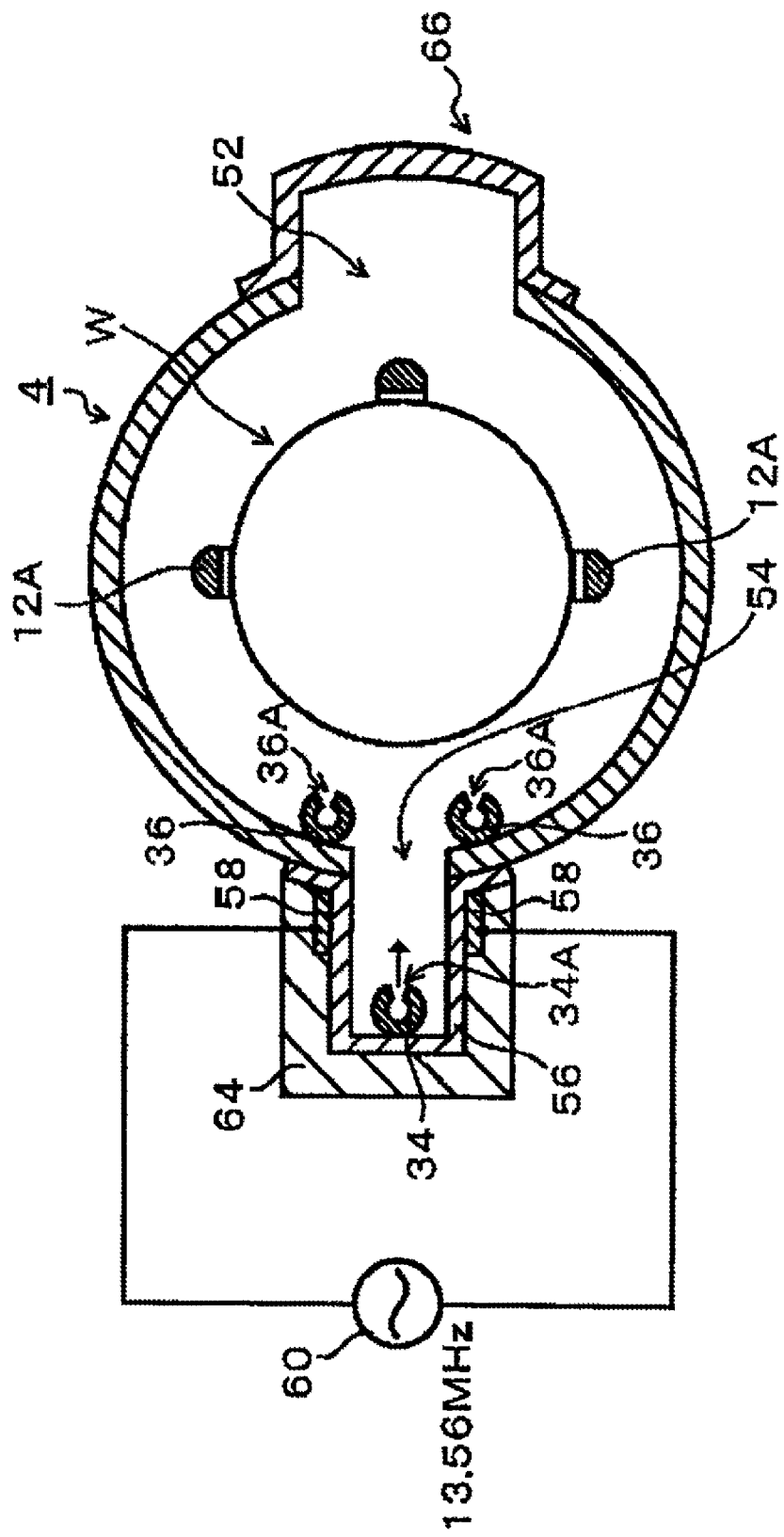
FIG. 6 is a cross-sectional view of the semiconductor device manufacturing apparatus.

Next, a method of manufacturing a semiconductor device having the configuration as described above will be described. FIG. 5 is a sectional view of a semiconductor device manufacturing apparatus (a film forming apparatus) used in a method of manufacturing a semiconductor device according to an embodiment of the present invention, and FIG. 6 is a cross-sectional view of the film forming apparatus, wherein a heating means is not illustrated.

As shown in FIG. 5, the film forming apparatus 2, which is capable of forming plasma, has a cylindrical processing container 4, which has a ceiling and has an opening on the bottom. The processing container 4 may be entirely formed of quartz, and a quartz top plate 6 is formed on the top of the processing container 4 to seal the processing container 4. Furthermore, a cylindrical manifold 8 formed of stainless steel is connected to the bottom opening of the processing container 4 via a sealing member 10, such as an O-ring, for example.

The bottom of the processing container 4 is supported by the manifold 8, and a quartz wafer boat 12 may be elevated or lowered to be freely inserted into and removed from the bottom of the manifold 8 as a supporting means on which a plurality of semiconductor wafers W are stacked as a plurality of objects to be processed. In the present embodiment, a supporting column 12A of the wafer boat 12 may support multiple layers of from about 50 to about 100 wafers W, each having a diameter of 300 mm, at approximately the same pitch.

The wafer boat 12 is disposed on a table 16 via a quartz thermos vessel 14, and the table 16 is supported by a rotating shaft 20 that penetrates a cover unit 18 which is formed of, for example, stainless steel and opens and closes the bottom opening of the manifold 8. A magnetic fluid seal 22 may be disposed at the penetrated portion of the rotating shaft 20, so that the rotating shaft 20 is tightly sealed and is rotatably supported. A sealing member 24, which is formed of, for example, an O-ring, is interposed between the peripheral portion of the cover unit 18 and the bottom of the manifold 8 to keep the processing container 4 sealed.

The rotating shaft 20 is attached at a front end of an arm 26 supported by an elevating/lowering mechanism (not shown), such as a boat elevator, so that the wafer boat 12 and the cover unit 18 may be elevated and inserted/removed into/from the processing container 4 together.

A supporting gas supplying means 28 for supplying a supporting gas to be plasmarized into the processing container 4, a source gas supplying means 30 for supplying a source gas, and a purge gas supplying means 32 for supplying an inert gas, e.g. N$_2$ gas, as a purge gas are formed in the manifold 8. In detail, the supporting gas supplying means 28 includes a supporting gas dispersing nozzle 34 formed of a quartz pipe which penetrates a sidewall of the manifold 8 to enter the processing container 4, is bent upward, and extends. A plurality of gas injecting holes 34A are formed in the supporting gas dispersing nozzle 34 at predetermined intervals in the lengthwise direction of the supporting gas dispersing nozzle 34, so that a supporting gas may be almost uniformly injected in a horizontal direction from each of the gas injecting holes 34A.

In the same regard, the source gas supplying means 30 includes a source gas dispersing nozzle 36 formed of a quartz pipe, which penetrates a sidewall of the manifold 8 to enter the processing container 4, is bent upward, and extends. As shown in FIG. 6, the source gas supplying means 30 includes two source gas dispersing nozzles 36. A plurality of gas injecting holes 36A are formed in each of the source gas dispersing nozzles 36 at predetermined intervals in the lengthwise direction of the source gas dispersing nozzles 36, so that a source gas may be almost uniformly injected in a horizontal direction from each of the gas injecting holes 36A. In the same regard, the purge gas supplying means 32 includes a gas nozzle 38 formed by penetrating the sidewall of the manifold 8. Gas passages 42, 44, and 46 are connected to the supporting gas dispersing nozzle 34, the source gas dispersing nozzles 36, and the gas nozzle 38, respectively.

The gas passages 42, 44, and 46 include opening/closing valves 42A, 44A, and 46A and flow controllers 42B, 44B, and 46B, such as mass-flow controllers, respectively, so that a supporting gas, a source gas, and an inert gas may be supplied under individual flow control. Supplying and stopping to supply each of the gases, controlling flows of the gases, and on/off control of a high frequency wave described below, for example, are performed by a control means 48, which is formed of a microcomputer, for example. Furthermore, the control means 48 also controls overall operations of the film forming apparatus 2. Furthermore, the control means 48 includes a recording medium 49, such as a floppy disk or a flash memory, which stores a program for controlling supplying and stopping to supply each of the gases, performing on/off control of a high frequency wave, and controlling the overall operations of the film forming apparatus 2.

An activating means 50, which activates supporting gas by generating plasma in the heightwise direction of the activating means 50, is formed in a portion of the sidewall of the processing container 4, and a narrow and long exhausting port 52, which is obtained by cutting a sidewall of the processing container 4 in the vertical direction, is formed in an opposite portion of the sidewall of the processing container 4, facing the activating means 50, to vacuum-exhaust the internal atmosphere of the processing container 4. In detail, in the activating means 50, a vertically long and narrow opening 54 is formed by cutting the sidewall of the processing container 4 to have a predetermined width, and a vertically long and narrow plasma partitioning wall 56, which is formed of quartz, for example, and has a concave cross-section, is formed to cover the opening 54 by being tightly weld-attaching to the outer surface of the processing container 4. Therefore, a portion of the sidewall of the processing container 4 becomes concave which digs outward, and thus the activating means 50, which is partially opened and communicates to the interior of the processing container 4, is integrally formed with the processing container 4. In other words, the internal space of the plasma partitioning wall 56 communicates to the interior of the processing container 4. The opening 54 is formed to have a sufficient vertical length to cover all wafers W, which are supported by the wafer boat 12, in the heightwise direction.

A pair of long and narrow plasma electrodes 58 are formed on outer surfaces of two opposite sidewalls of the plasma partitioning wall 56, such that the plasma electrodes 58 face each other in the heightwise direction (vertical direction). Furthermore, a high frequency power source 60 for use in plasma generation is connected to the plasma electrodes 58 via a power supply line 62, so that a high frequency voltage, e.g. a voltage having a frequency of 13.56 MHz, may be applied to the plasma electrodes 58 to generate plasma. Furthermore, the frequency of the high frequency voltage is not limited to 13.56 MHz, and another frequency, e.g. 400 kHz, may be used. The supporting gas dispersing nozzle 34, which extends upward in the processing container 4, is bent in a direction outward with respect to the center of the processing container 4, is located at the innermost location within the plasma partitioning wall 56 (the farthest location from the center of the processing container 4), and extends upward along the innermost location. Thus, when the high frequency power source 60 is turned on, supporting gas injected from the gas injecting holes 34A of the supporting gas dispersing nozzle 34 is activated in the innermost location within the plasma partitioning wall 56 and disperses toward the center of the processing container 4.

An insulation protecting cover 64, which may be formed of quartz, is attached to the outer surface of the plasma partitioning wall 56 to cover the plasma partitioning wall 56. Furthermore, a coolant passage (not shown) is formed in the insulation protecting cover 64, such that the plasma electrodes 58 may be cooled by flowing cooled nitrogen gas in the coolant passage. The two source gas dispersing nozzles 36 are disposed outside and close to the opening 54 of the plasma partitioning wall 56, that is, disposed within the processing container 4, to face each other and extend vertically, so that source gas may be injected toward the center of the processing container 4 from each of the gas injecting holes 36A formed in the source gas dispersing nozzles 36.

Meanwhile, an exhausting port cover unit 66, which is formed of quartz and has a C-shaped cross-section to cover the exhausting port 52, is weld-attached to the exhausting port 52 which is formed to face the opening 54. The exhausting port cover unit 66 extends upward along the sidewall of the processing container 4, and the space formed by the exhausting port cover unit 66 is vacuum-exhausted by a vacuum exhausting unit (not shown) including a vacuum pump from a gas outlet 68 on top of the processing container 4. Furthermore, a cylindrical heating means 70 is formed to surround the outer perimeter of the processing container 4 to heat the processing container 4 and the wafers W within the processing container 4.

Next, a method of manufacturing a semiconductor device via an ALD film formation process that is performed using the film forming apparatus will be described, according to an embodiment of the present invention. In this case, the wafer boat 12, on which a plurality of wafers W are stacked at room temperature, is elevated from below the processing container 4 which is heated to a predetermined temperature in advance, and loaded into the processing container 4, and the processing container 4 is sealed by covering the bottom opening of the manifold 8 by the cover unit 18, wherein the diameter of each of the wafers W is 300 mm, and there may be about 50 to about 100 wafers W stacked on the wafer boat 12.

Next, the internal atmosphere of the processing container 4 is vacuum-exhausted to maintain the internal pressure of the processing container 4 at a predetermined processing pressure. At the same time, temperatures of the wafers W are increased by increasing power supplied to the heating means 70 to maintain a processing temperature. Then, various processing gases are alternately and intermittently supplied from the source gas supplying means 30 and the supporting gas supplying means 28, so that thin films are sequentially formed on surfaces of the wafers W that are supported by the rotating wafer boat 12. Furthermore, at this point, the high frequency power source (RF power source) 60 is turned on to generate plasma.

According to the present embodiment, as shown in FIG. 1, the tunnel oxide layer 111 and the charge trapping layer 112 are sequentially formed on the silicon substrate 110, and then the blocking oxide layer 113 is formed thereon. Here, a source gas, e.g. TMA gas, and a supporting gas, which is oxygen gas, are alternately and intermittently supplied and are activated by plasma.

Figure 7:
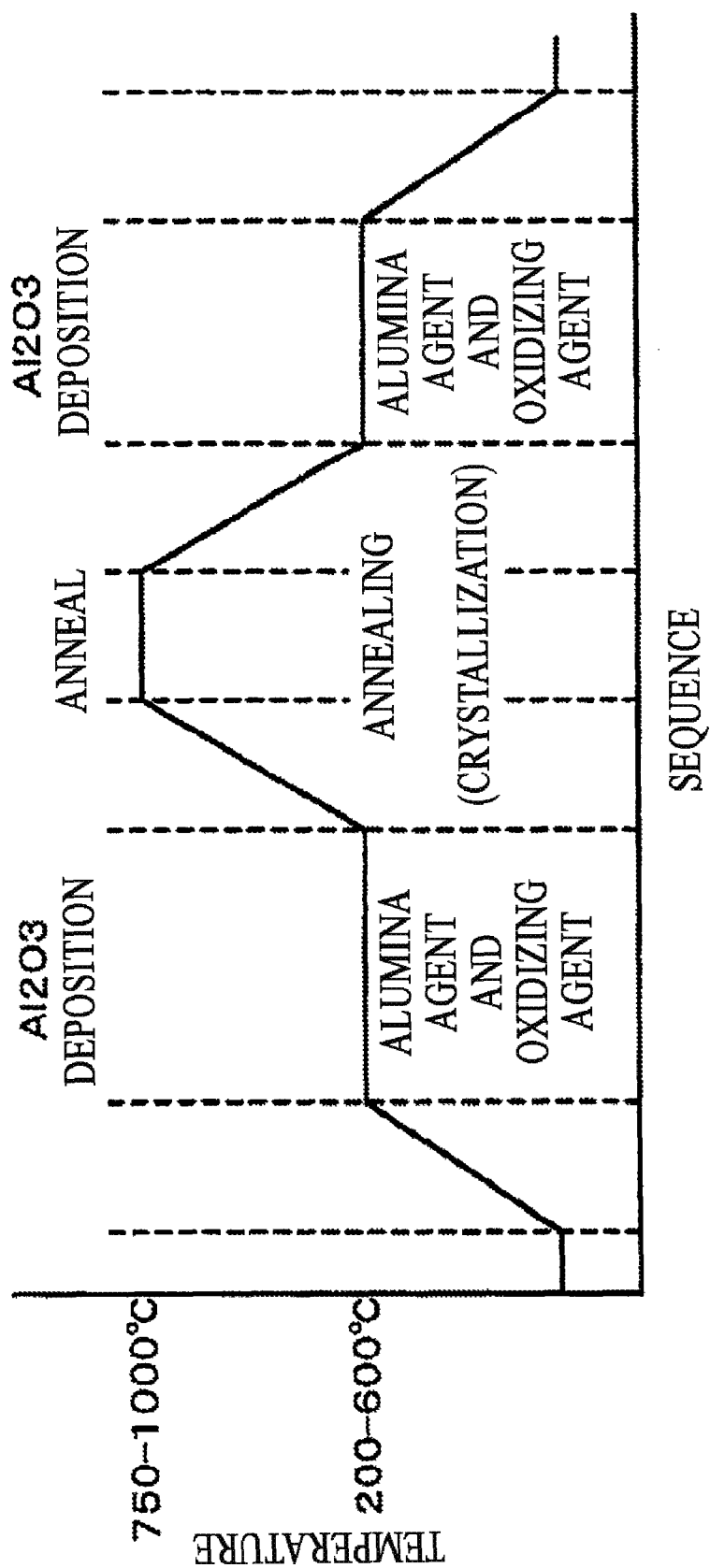
FIG. 7 is a diagram for describing a method of manufacturing a semiconductor device according to an embodiment of the present invention.

Next, as shown in FIG. 7, an amorphous $Al_2O_3$ layer is formed at a temperature of about 200° C. to about 600° C., and then the amorphous-$Al_2O_3$ layer is annealed (heated) by raising the internal temperature of the processing container 4 to a temperature of about 750° C. to about 1000° C., so that the amorphous-$Al_2O_3$ layer is crystallized. Accordingly, the crystalline layer 113a is formed.

Next, the internal temperature of the processing container 4 is dropped to a temperature of about 200° C. to about 600° C., and an amorphous layer, e.g. an amorphous $Al_2O_3$ layer, is formed. As a result, the blocking oxide layer 113, which includes the crystalline layer 113a and the amorphous layer 113b, may be formed. As described above, according to the present embodiment, the blocking oxide layer 113, which includes the crystalline layer 113a and the amorphous layer 113b, may be formed on a plurality of wafers W at the same time in the same processing container 4.

The crystalline layer 113a may not only be formed of a crystalline $Al_2O_3$ layer, but also be formed of a crystalline-$HfO_2$ layer, a crystalline-$ZrO_2$ layer, a crystalline-$Ta_2O_5$ layer, a crystalline-$Y_2O_3$ layer, a crystalline-lanthanoid oxide layer, or the like. Furthermore, the amorphous layer 113b is not limited to an amorphous-$Al_2O_3$ layer, and the amorphous layer 113b may be formed of an amorphous-$SiO_2$ layer, an amorphous-aluminum silicate layer, or an amorphous-$Al_2O_3$—$SiO_2$ laminated layer.

Although the crystalline layer 113a is formed by crystallizing an amorphous layer and then the amorphous layer 113b is formed in the above embodiment, the blocking oxide layer 113, which includes the crystalline layer 113a and the amorphous layer 113b, may be formed by forming an amorphous-$Al_2O_3$ layer, forming a layer that may not be easily crystallized due to the $Al_2O_3$ layer, e.g. a $SiO_2$ layer, an aluminum silicate layer, or an $Al_2O_3$—$SiO_2$ laminated layer, and annealing the amorphous $Al_2O_3$ layer at a temperature at which amorphous-$Al_2O_3$ layer is crystallized and a $SiO_2$ layer, an aluminum silicate layer, or an $Al_2O_3$—$SiO_2$ laminated layer is not crystallized.

Furthermore, the blocking oxide layer 113, which includes the crystalline layer 113a and the amorphous layer 113b, may be formed by stacking $Al_2O_3$—$SiO_2$ laminated layers with different $Al_2O_3$ and $SiO_2$ composition ratios to form a laminated layer in which the composition ratio of $Al_2O_3$ gradually decreases and the composition ratio of $SiO_2$ gradually increases, by heating the laminated layer to crystallize only portions containing more $Al_2O_3$, which are easily crystallized, and by keeping portions containing more $SiO_2$ amorphous.

The blocking oxide layer 113, which includes the crystalline layer 113a and the amorphous layer 113b, may also be formed by stacking aluminum silicate layers with different aluminum and silicon composition ratios to form an aluminum silicate layer in which the composition ratio of aluminum gradually decreases and the composition ratio of silicon gradually increases, by heating the aluminum silicate layer to crystallize only portions containing more aluminum, which are easily crystallized, and to keep portions containing more silicon, which are not easily crystallized, amorphous.

Figure 8:
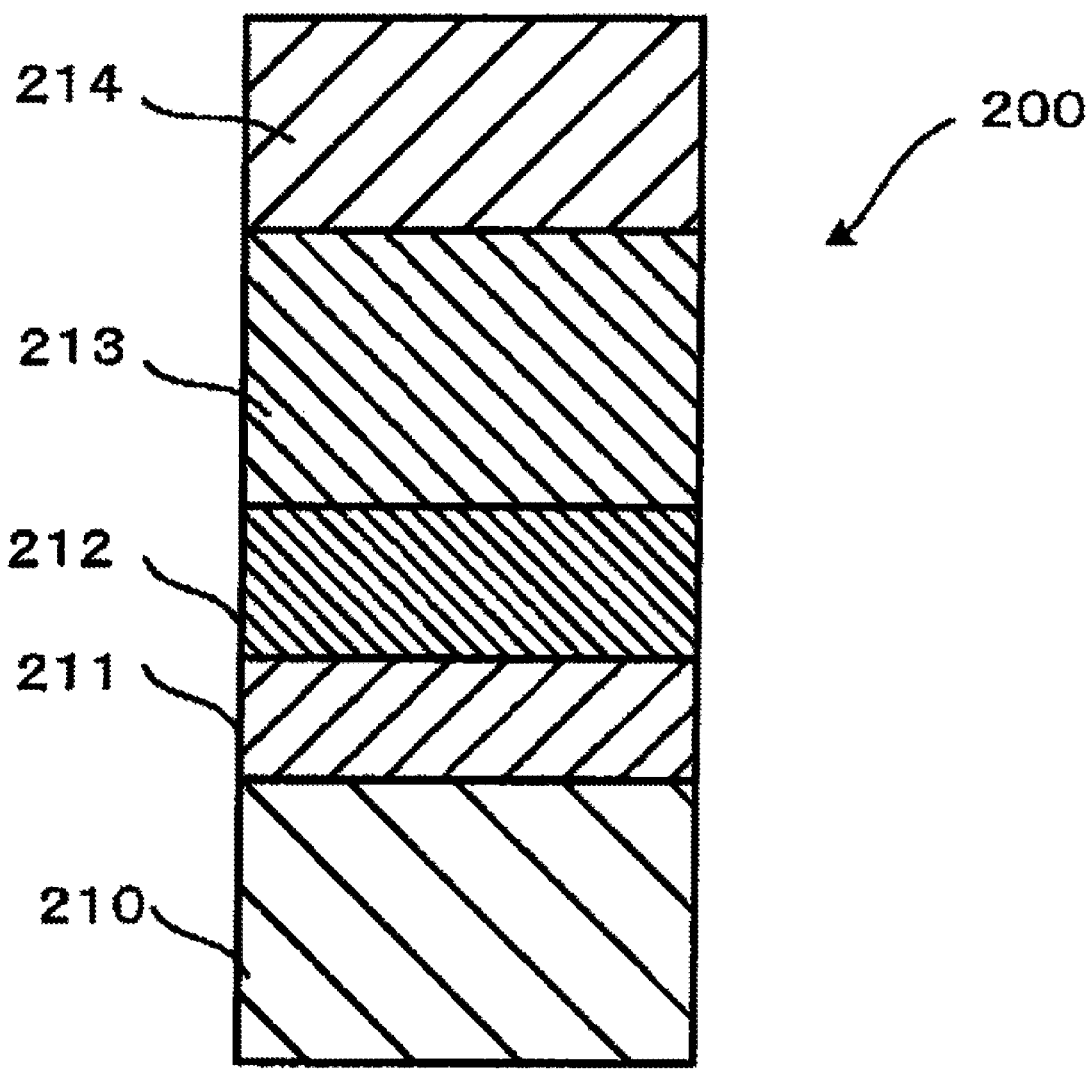
FIG. 8 is a diagram schematically showing the sectional view of the configuration of the major portion of a semiconductor device according to another embodiment of the present invention.

Next, a semiconductor device 200 (a charge trapping type non-volatile memory device (flash memory)) according to another embodiment of the present invention will be described with reference to FIG. 8. FIG. 8 is a magnified diagram schematically showing the configuration of the major portion of the semiconductor device according to the present embodiment. Referring to FIG. 8, the semiconductor device 200 has a stacked structure in which a tunnel oxide layer 211, a charge trapping layer 212, a blocking oxide layer 213, and a gate electrode 214 are sequentially stacked on a silicon substrate 210.

The tunnel oxide layer 211 is formed of a silicon oxide layer ($SiO_2$ layer). The charge trapping layer 212 is formed of a crystalline layer, and the blocking oxide layer 213 is formed of an amorphous layer. Examples of the crystalline layer constituting the charge trapping layer 212 may include a crystalline alumina layer ($Al_2O_3$ layer) or a crystalline high-k layer, such as a $HfO_2$ layer, a $ZrO_2$ layer, a $Ta_2O_5$ layer, a $Y_2O_3$ layer, or a lanthanoid oxide layer. The amorphous layer constituting the blocking oxide layer 213 may be formed of a HTO layer ($SiO_2$ layer), an aluminum silicate layer, an amorphous-$Al_2O_3$ layer, an $Al_2O_3$—$SiO_2$ laminated layer, or the like.

The gate electrode 214 may be formed of a polysilicon layer, a TaN layer, a metal layer, or the like.

In the semiconductor device 200 according to the present embodiment, the charge trapping layer 212 may be formed of a crystalline layer and the blocking oxide layer 213 may be formed of an amorphous layer. The stacked structure of the semiconductor device 200 according to the present embodiment may be manufactured using the method of manufacturing a semiconductor device described above and by using the film forming apparatus 2 illustrated in FIGS. 5 and 6.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A semiconductor device having a stacked structure, comprising a tunnel oxide layer, a charge trapping layer, a blocking oxide layer, and a gate electrode sequentially formed on a silicon substrate,
wherein the blocking oxide layer comprises a crystalline layer disposed to contact the charge trapping layer and an amorphous layer disposed to contact the gate electrode.

2. The semiconductor device of claim 1, wherein the charge trapping layer comprises SiN.

3. The semiconductor device of claim 1, wherein the crystalline layer comprises any one of $Al_2O_3$, $HfO_2$, $ZrO_2$, $Ta_2O_5$, $Y_2O_3$, and a lanthanoid oxide.

4. The semiconductor device of claim 1, wherein the amorphous layer comprises any one of a $SiO_2$ layer, an aluminum silicate layer, an $Al_2O_3$ layer, and an $Al_2O_3$—$SiO_2$ laminated layer.

5. A method of manufacturing a semiconductor device, in which a tunnel oxide layer, a charge trapping layer, a blocking oxide layer, and a gate electrode are sequentially formed on a silicon substrate, wherein the blocking oxide layer is formed using a method comprising:
forming a crystalline layer on the charge trapping layer; and
forming an amorphous layer over the crystalline layer,
wherein the amorphous layer is formed to contact the gate electrode.

6. The method of claim 5, wherein the forming of the crystalline layer comprises:
forming an amorphous layer on the charge trapping layer; and
heating the amorphous layer, so that the amorphous layer is crystallized to serve as the crystalline layer.

7. The method of claim 5, wherein the forming of the crystalline layer and the forming of the amorphous layer is consecutively performed by a batch processing apparatus within a same cylindrical processing container,
wherein the batch processing apparatus, vertically stacks a plurality of the silicon substrates to be apart from each other within the processing container and processes the silicon substrates, and comprises a mechanism for supplying processing gas into the processing container, a mechanism for plasmarizing the processing gas, a mechanism for heating the silicon substrates, and a mechanism for vacuum-exhausting the internal atmosphere of the processing container.

8. A method of manufacturing a semiconductor device, in which a tunnel oxide layer, a charge trapping layer, a blocking oxide layer, and a gate electrode are sequentially formed on a silicon substrate, wherein the blocking oxide layer is formed using a method comprising:
forming a first amorphous layer on the charge trapping layer;
forming a second amorphous layer, which is not easily crystallized by the first amorphous layer, on the first amorphous layer; and
crystallizing the first amorphous layer by heating at a temperature at which the first amorphous layer is to be crystallized and the second amorphous layer is not to be crystallized.

9. The method of claim 8, wherein the forming of the first amorphous layer and the forming of the second amorphous layer is consecutively performed by a batch processing apparatus within a same cylindrical processing container,
wherein the batch processing apparatus vertically stacks a plurality of the silicon substrates to be apart from each other within the processing container and processes the silicon substrates, and comprises a mechanism for supplying processing gas into the processing container, a mechanism for plasmarizing the processing gas, a mechanism for heating the silicon substrates, and a mechanism for vacuum-exhausting the internal atmosphere of the processing container.

10. A method of manufacturing a semiconductor device, in which a tunnel oxide layer, a charge trapping layer, a blocking oxide layer, and a gate electrode are sequentially formed on a silicon substrate,
wherein forming of the charge trapping layer comprises forming a crystalline layer, and
forming of the blocking oxide layer comprises forming an amorphous layer.

11. The method of claim 10, wherein the forming of the charge trapping layer and the forming of the blocking oxide layer is consecutively performed by a batch processing apparatus within a same cylindrical processing container,
wherein the batch processing apparatus vertically stacks a plurality of the silicon substrates to be apart from each other within the processing container and processes the silicon substrates, and comprises a mechanism for supplying processing gas into the processing container, a mechanism for plasmarizing the processing gas, a mechanism for heating the silicon substrates, and a mechanism for vacuum-exhausting the internal atmosphere of the processing container.

* * * * *